United States Patent
Yoshida

(10) Patent No.: US 8,006,165 B2
(45) Date of Patent: Aug. 23, 2011

(54) MEMORY CONTROLLER AND SEMICONDUCTOR MEMORY DEVICE

(75) Inventor: Norikazu Yoshida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1090 days.

(21) Appl. No.: 11/770,235

(22) Filed: Jun. 28, 2007

(65) Prior Publication Data

US 2008/0016430 A1     Jan. 17, 2008

(30) Foreign Application Priority Data

Jun. 30, 2006  (JP) ................. 2006-182632

(51) Int. Cl.
G06F 11/10 (2006.01)
G11C 29/00 (2006.01)
(52) U.S. Cl. .................. 714/763; 714/773; 714/779
(58) Field of Classification Search .................. 714/773, 714/779, 763
See application file for complete search history.

(56) References Cited

U.S. PATENT DOCUMENTS

| | | | |
|---|---|---|---|
| 4,500,926 A | 2/1985 | Yoshimaru | |
| 5,956,743 A | 9/1999 | Bruce et al. | |
| 6,279,134 B1 * | 8/2001 | Yamamoto et al. | 714/763 |
| 6,351,412 B1 * | 2/2002 | Nozoe et al. | 365/185.09 |
| 6,360,346 B1 * | 3/2002 | Miyauchi et al. | 714/763 |
| 6,651,212 B1 * | 11/2003 | Katayama et al. | 714/763 |
| 6,904,492 B2 * | 6/2005 | Hogan | 711/102 |
| 7,127,660 B2 * | 10/2006 | Blaum | 714/761 |
| 7,231,585 B2 * | 6/2007 | Vainsencher et al. | 714/784 |
| 7,549,109 B2 * | 6/2009 | Harrand | 714/763 |
| 7,581,153 B2 * | 8/2009 | Micheloni et al. | 714/763 |
| 7,739,578 B2 * | 6/2010 | Hwang et al. | 714/769 |
| 7,810,016 B2 * | 10/2010 | Takahashi | 714/768 |

* cited by examiner

Primary Examiner — Stephen M Baker
(74) Attorney, Agent, or Firm — Oblon, Spivak, McClelland, Maier & Neustadt, L.L.P.

(57) ABSTRACT

A memory controller includes a buffer to which data, which is to be transferred to a memory, is input, an ECC parity generating unit which generates an ECC parity in units of a predetermined data length from the data which is to be transferred to the memory, and a memory interface which adds the generated ECC parity in units of the predetermined data length, and delivers the data with the ECC parity to the memory. When a data length of the data which is to be transferred to the memory is less than the predetermined data length, the ECC parity generating unit regards data of a part that is short of the predetermined data length as "0", and generates the ECC parity from the data of less than the predetermined data length.

14 Claims, 14 Drawing Sheets

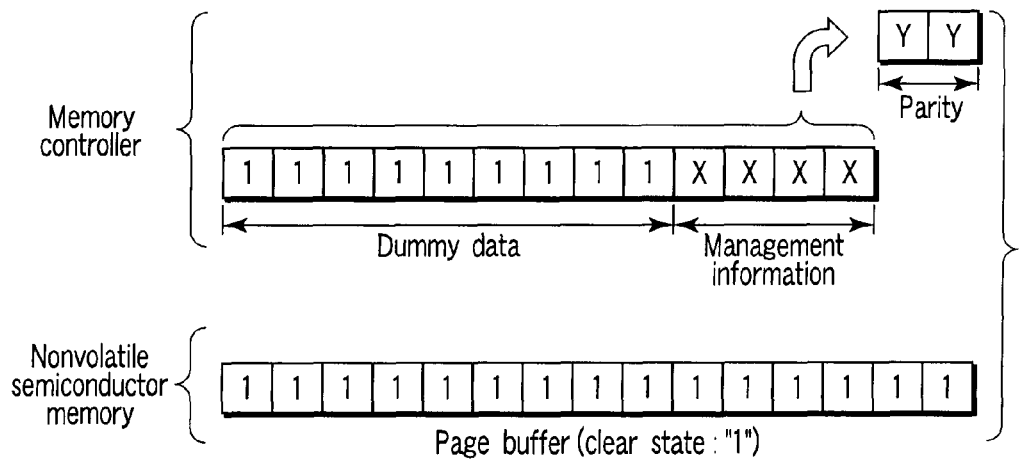
F I G. 5
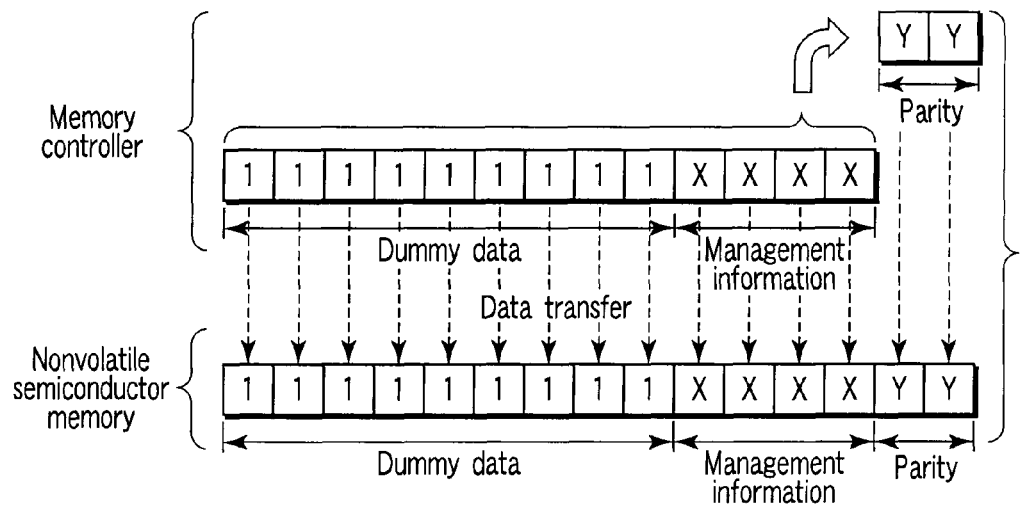
F I G. 6

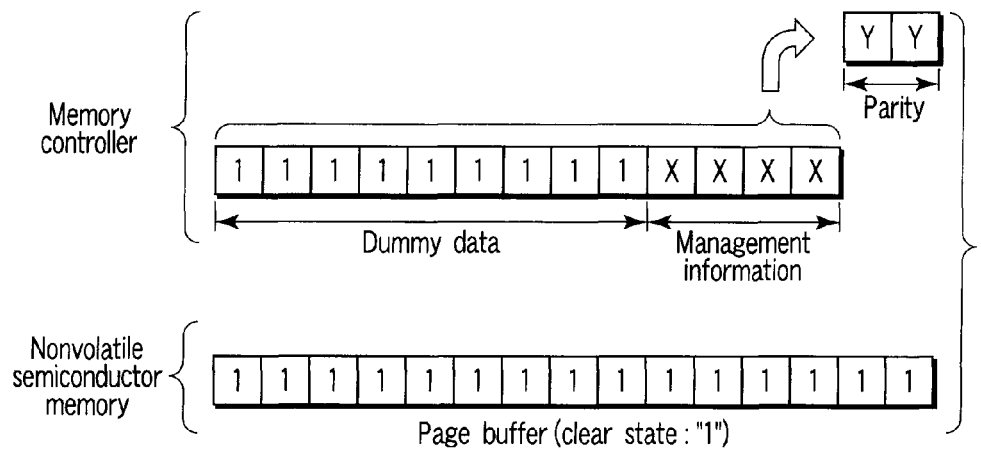
F I G. 7
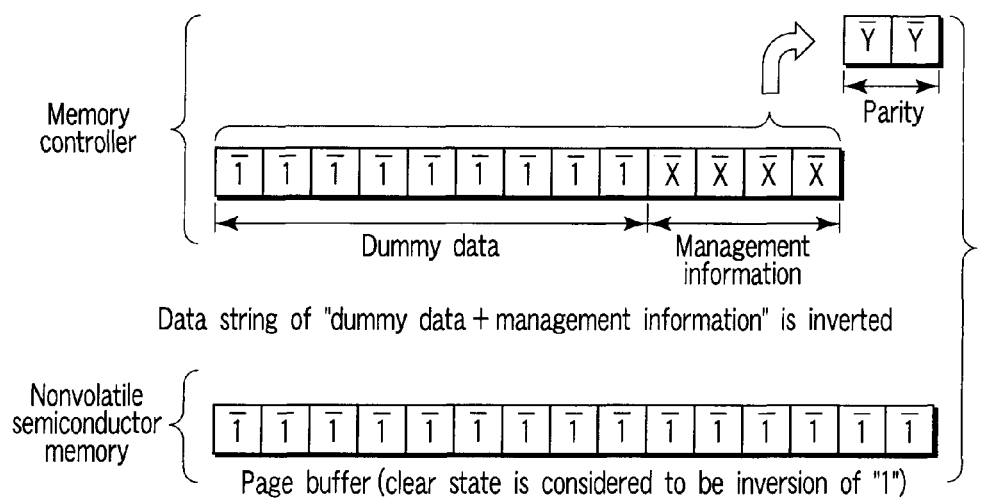
F I G. 8

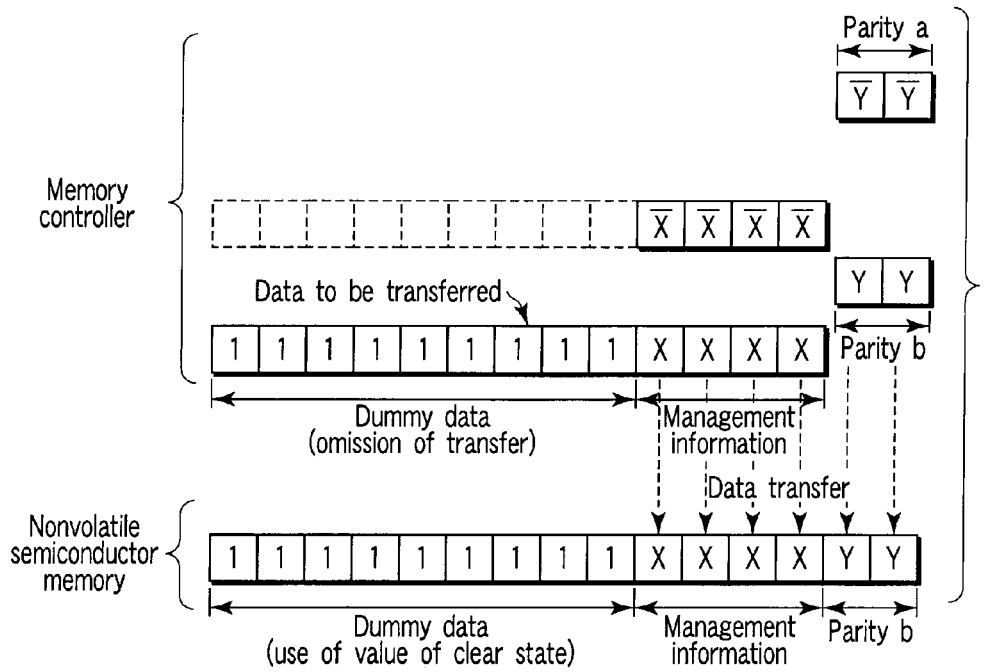
F I G. 13
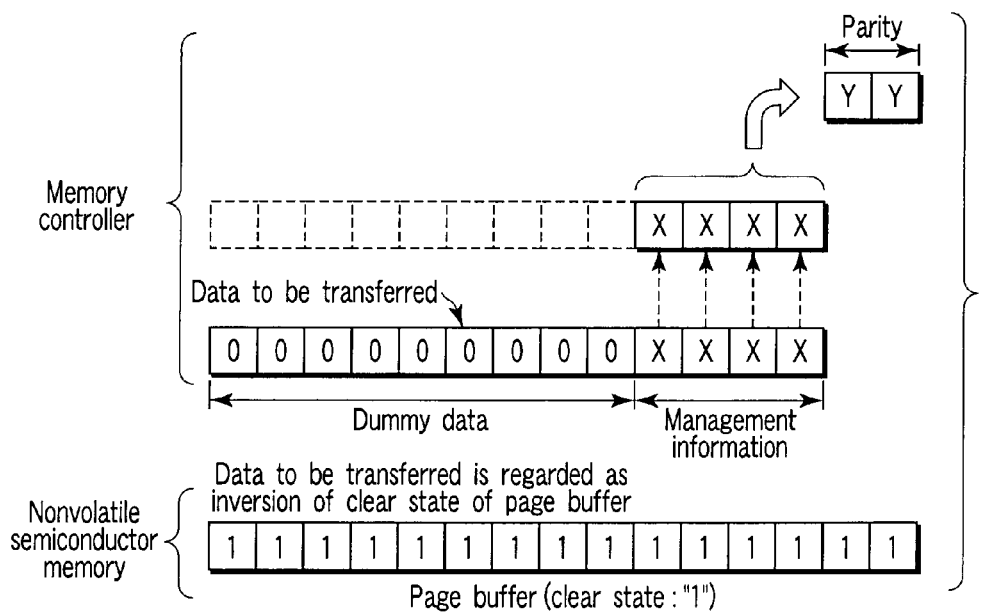
F I G. 14

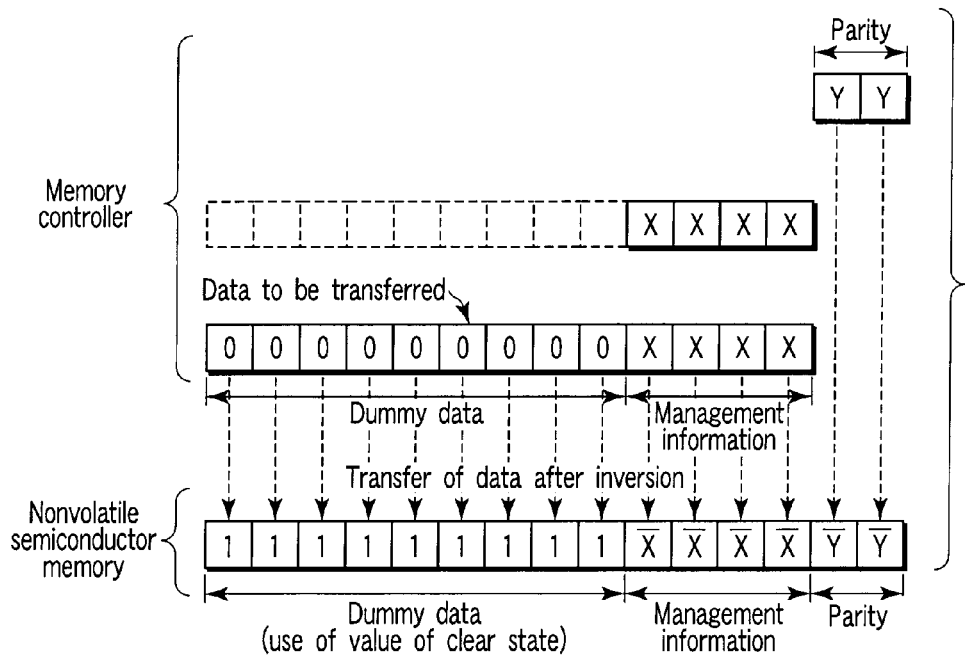
F I G. 15
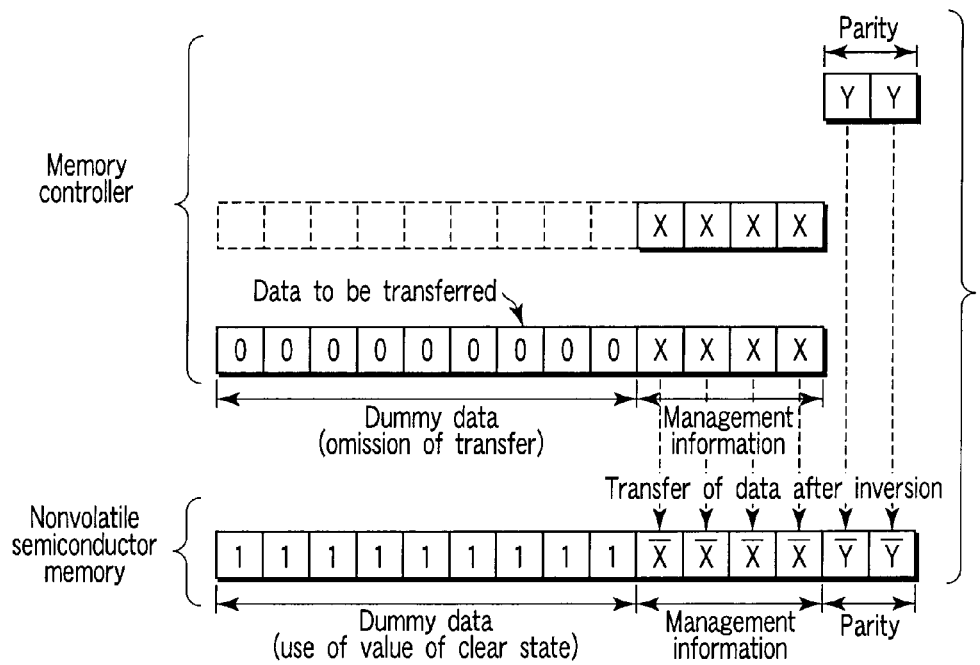
F I G. 16

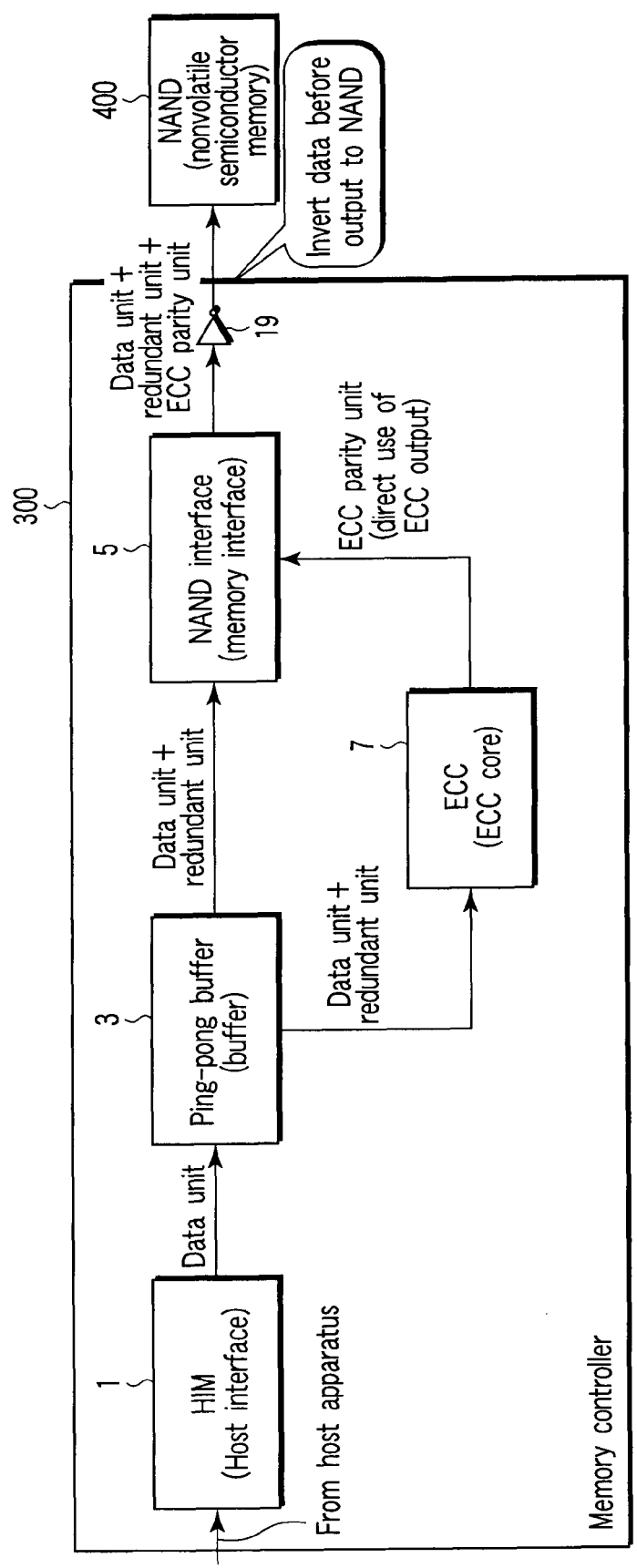
F I G. 20

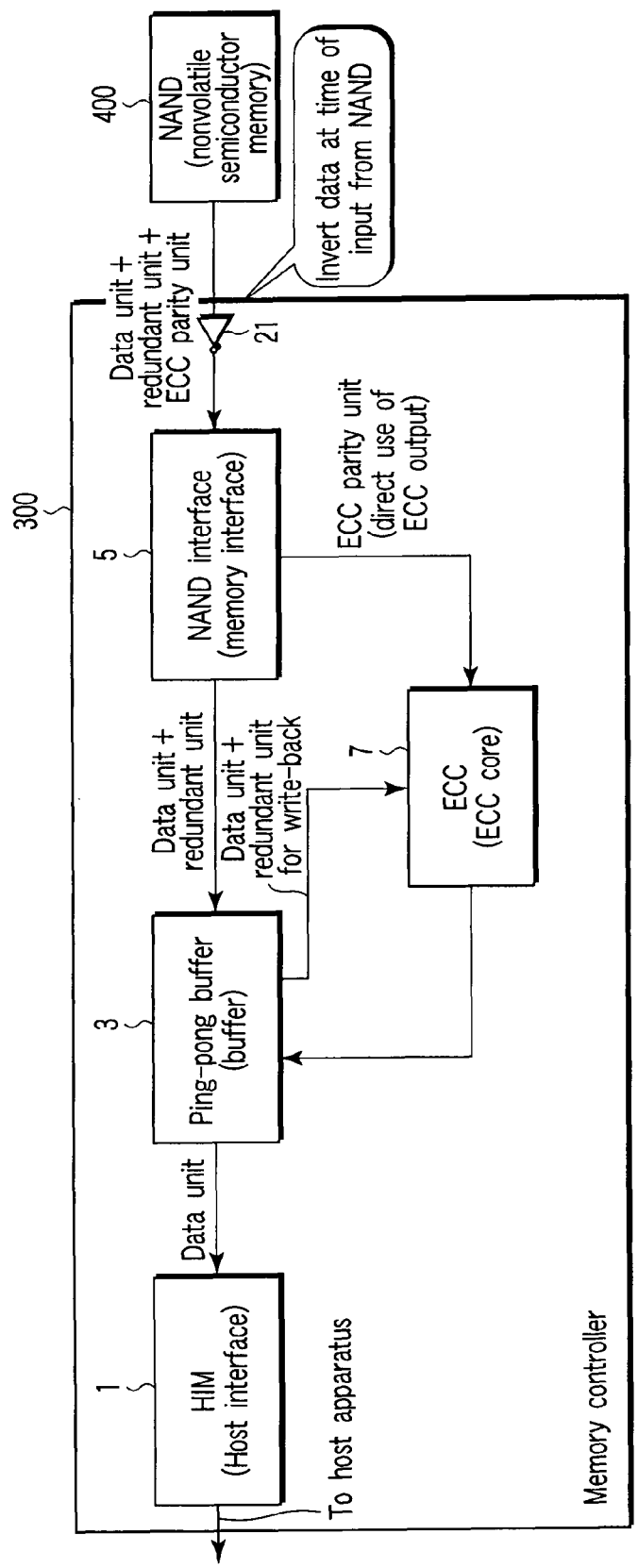
F I G. 21

| Pin No. | Signal |
|---|---|
| Pin 1 | Card detection/data 3 (DAT3) |
| Pin 2 | Command (CMD) |
| Pin 3 | Vss |
| Pin 4 | Vdd |
| Pin 5 | Clock (CLK) |
| Pin 6 | Vss |
| Pin 7 | Data 0 (DAT0) |
| Pin 8 | Data 1 (DAT1) |
| Pin 9 | Data 2 (DAT2) |

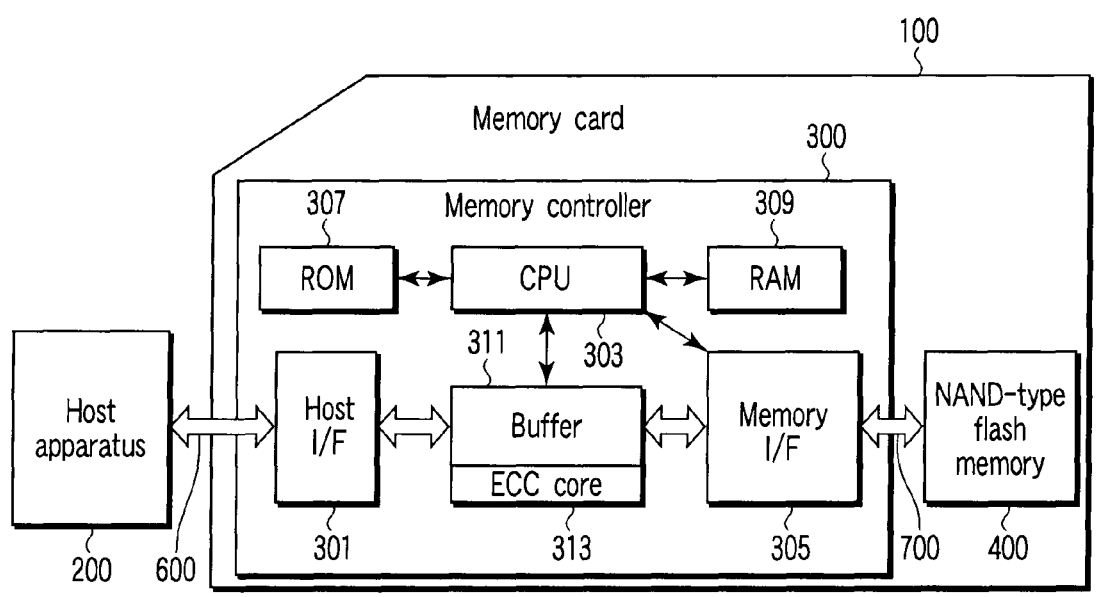
F I G. 24

MEMORY CONTROLLER AND SEMICONDUCTOR MEMORY DEVICE

CROSS-REFERENCE TO RELATED APPLICATIONS

This application is based upon and claims the benefit of priority from prior Japanese Patent Application No. 2006-182632, filed Jun. 30, 2006, the entire contents of which are incorporated herein by reference.

BACKGROUND OF THE INVENTION

1. Field of the Invention

The present invention relates generally to a memory controller and a semiconductor memory device, and relates, for example, to a memory controller which includes an ECC (Error Correcting Code) circuit.

2. Description of the Related Art

There is known a page format of a memory card including a nonvolatile semiconductor memory as a main memory, the page format being configured such that only one redundant unit area, in which management information is written, can be secured in every page. In particular, in the case where the nonvolatile semiconductor is a multi-value memory, such a page format is adopted.

Assume now that the above-described page format was adopted and data was not fully written in the page, that is, the length of the data was less than a predetermined data length.

In this case, in order to write management information in a redundant unit data area, a memory controller, which controls the nonvolatile semiconductor memory, adds dummy data at one part of the format in which the management information is written. Thus, the data length of this part is set at a predetermined data length for generating a parity for error detection/correction (ECC). Thereafter, the memory controller inputs a data string of a predetermined data length, which includes the dummy data+management information, to an ECC core that is provided in the memory controller. Then, the memory controller generates an ECC parity from the data string of the predetermined data length. Subsequently, the data string including the dummy data, management information and ECC parity is sent to the nonvolatile semiconductor memory, and the data of the data string is written in the nonvolatile semiconductor memory.

However, the clear state of a page buffer, which is provided in the nonvolatile semiconductor memory, is "1". Thus, the dummy data must be all set at "1", and the ECC parity is generated from the data string of all "1" dummy data+management information.

As described above, the conventional memory controller executes input of all "1" dummy data to the ECC core, and generation of the ECC parity from the data string of all "1" dummy data+management information. Hence, a decrease in time that is needed for data transfer to the nonvolatile semiconductor memory is hindered.

BRIEF SUMMARY OF THE INVENTION

According to an aspect of the present invention, there is provided a memory controller which is connectable to a memory and controls the memory, comprising: a buffer to which data, which is to be transferred to the memory, is input; an ECC parity generating unit which generates an ECC parity in units of a predetermined data length from the data which is to be transferred to the memory; and a memory interface which adds the generated ECC parity in units of the predetermined data length, and delivers the data with the ECC parity to the memory, wherein when a data length of the data which is to be transferred to the memory is less than the predetermined data length, the ECC parity generating unit regards data of a part that is short of the predetermined data length as "0", and generates the ECC parity from the data of less than the predetermined data length.

According to another aspect of the present invention, there is provided a semiconductor memory device comprising: a memory; and a memory controller which is connectable to the memory and controls the memory, the memory controller comprising: a buffer to which data, which is to be transferred to the memory, is input; an ECC parity generating unit which generates an ECC parity in units of a predetermined data length from the data which is to be transferred to the memory; and a memory interface which adds the generated ECC parity in units of the predetermined data length, and delivers the data with the ECC parity to the memory, wherein when a data length of the data which is to be transferred to the memory is less than the predetermined data length, the ECC parity generating unit regards data of a part that is short of the predetermined data length as "0", and generates the ECC parity from the data of less than the predetermined data length.

BRIEF DESCRIPTION OF THE SEVERAL VIEWS OF THE DRAWING

FIG. 5 shows a data transfer method according to a reference example;

FIG. 6 shows a data transfer method according to the reference example;

FIG. 7 shows the relationship between the clear state of a page buffer and a data string for generating a parity in the reference example;

FIG. 8 shows a modification of the relationship shown in FIG. 7;

FIG. 13 shows the first example of the data transfer method that is executed by the memory controller according to the first embodiment of the invention;

FIG. 14 shows a second example of the data transfer method that is executed by the memory controller according to the first embodiment of the invention;

FIG. 15 shows the second example of the data transfer method that is executed by the memory controller according to the first embodiment of the invention;

FIG. 16 shows the second example of the data transfer method that is executed by the memory controller according to the first embodiment of the invention;

FIG. 20 is a block diagram showing a second example of the hardware structure (at a time of a write process) of the memory controller according to the second embodiment of the invention;

FIG. 21 is a block diagram showing the second example of the hardware structure (at a time of a read process) of the memory controller according to the second embodiment of the invention;

FIG. 24 is a block diagram showing an example of the hardware structure of the memory card.

DETAILED DESCRIPTION OF THE INVENTION

Figure 1:
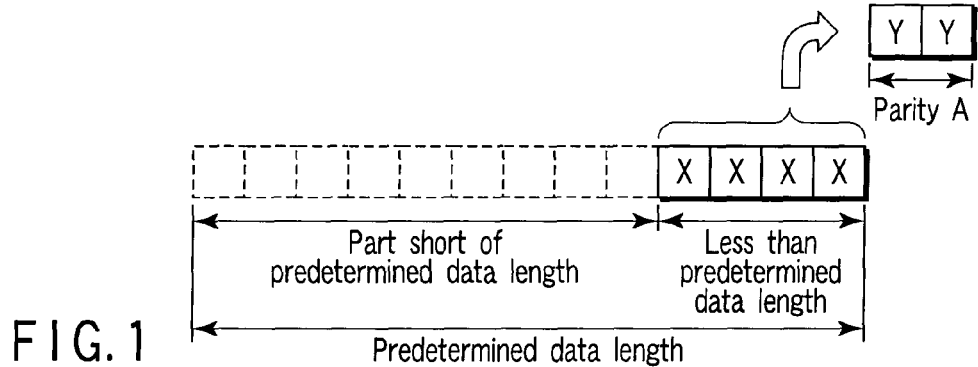
FIG. 1 shows a state in which a parity A is generated from data of less than a predetermined data length.

Embodiments of the present invention will now be described with reference to the accompanying drawings. In the description below, common parts are denoted by like reference numerals throughout the drawings.

First Embodiment

Figure 2:
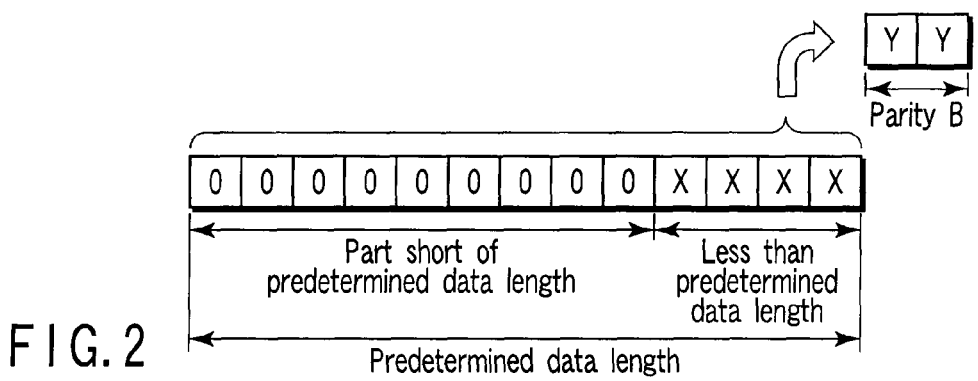
FIG. 2 shows a state in which a parity B is generated from data of a predetermined data length.

If a cyclic code, for example, is used for an error correcting code, there may be a case in which an ECC parity that is generated from a data string of less than a predetermined data length is identical to an ECC parity that is generated from a data string of a predetermined data length, in which a part that is short of the predetermined data length is filled with data "0". For example, assume that an ECC parity was generated from a data string of less than a predetermined data length, as shown in FIG. 1. The generated parity is referred to as "parity A". Also assume that an ECC parity was generated from a data string of a predetermined data length, in which a part short of the predetermined data length is filled with data "0", as shown in FIG. 2. The generated parity is referred to as "parity B". In the case where a cyclic code, e.g. a Reed-Solomon code, is used as an error correcting code, the parity A becomes identical to the parity B, as shown in FIG. 3.

Figure 3:
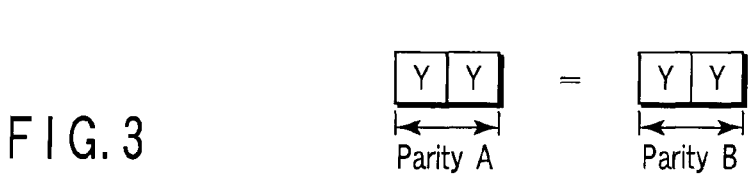
FIG. 3 shows a relationship between the parity A and parity B.

FIG. 1 to FIG. 3 are simplified drawings for explaining the phenomenon that the parity A becomes identical to the parity B. It should be noted, however, that the number of data strings, etc. are different from actual ones. The same applies to FIG. 4 and the following Figures.

In a first embodiment of the invention, the part short of the predetermined data length is regarded as data "0". Thereby, an exact ECC parity was successfully generated from a short data string consisting of only management information, and the input of dummy data to an ECC core was successfully omitted.

A more detailed description is given below.

To help understand the present embodiment, a data transfer method in which dummy data is added is described as a reference example. This description is a supplemental description for the understanding of the embodiment, and constitutes a part of the description of the embodiment.

Figure 4:
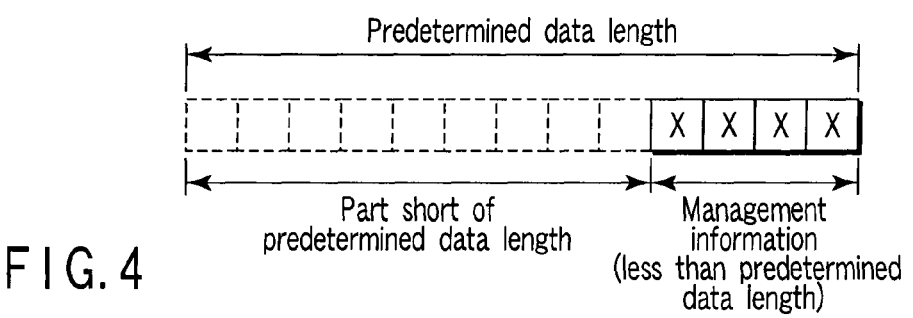
FIG. 4 shows the structure of a data string having a predetermined data length.

FIG. 4 shows the structure of a data string having a predetermined data length.

As shown in FIG. 4, the "predetermined data length" is a unit for determining the number of bits, to which each parity is added. Error detection/correction is executed in units of the predetermined data length. The number of errors which can be detected in the predetermined data length and the number of errors which can be corrected in the predetermined data length are determined in accordance with the performance of the error correcting code.

Assume now that a short data string of less than the predetermined data length was input to a memory controller. An example of the short data string of less than the predetermined data length is management information, as shown in FIG. 4.

Subsequently, as shown in FIG. 5, the memory controller adds dummy data "1" to the part short of the predetermined data length, and fills the part short of the predetermined data length with data "1", thus making the length of the data string including the management information equal to the predetermined data length. The reason why the dummy data is "1" is that the clear state of the page buffer of the nonvolatile semiconductor memory is "1". The clear state "1" indicates that the memory cell in the nonvolatile semiconductor memory is in the erase state.

Next, the memory controller inputs the data string of the predetermined data length, which comprises "dummy data+management information", to the ECC core. The ECC core generates an ECC parity from the data string of "dummy data+management information".

Following the above, as shown in FIG. 6, the memory controller transfers the data string of "dummy data+management information+parity" to a page buffer in the nonvolatile semiconductor memory. The page buffer temporarily stores the transferred data string of "dummy data+management information+parity". Then, data is written in the memory cells in the nonvolatile semiconductor memory in accordance with the data that is temporarily stored in the page buffer.

Consideration is now given to the relationship between the clear state of the page buffer and the data string from which the parity is generated. FIG. 7 shows the relationship, in a reference example, between the clear state of the page buffer and the data string from which the parity is generated. The relationship shown in FIG. 7 is a relationship at a time when the clear state of the page buffer is "1". This relationship may be modified as shown in FIG. 8.

Figure 9:
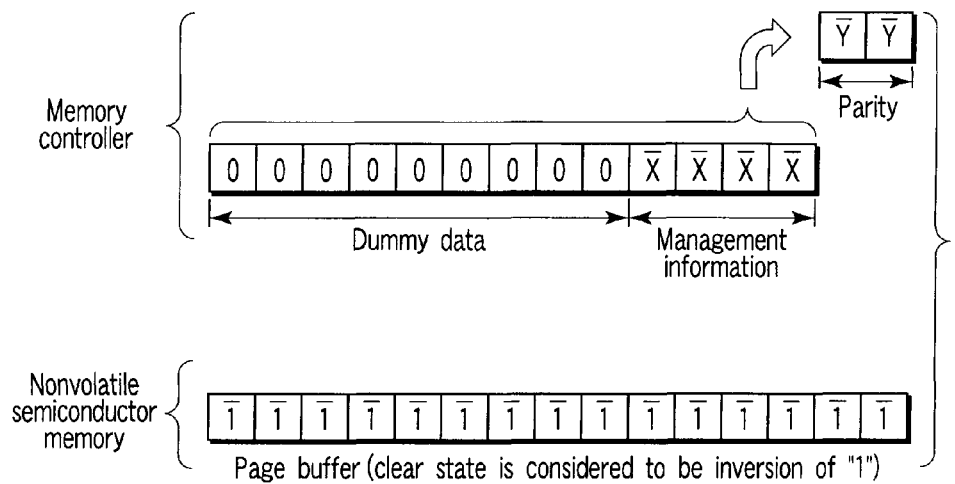
FIG. 9 shows a modification of the relationship shown in FIG. 8.

The relationship shown in FIG. 8 is a relationship in a case where the clear state of the page buffer is considered as "inversion of 1". In this case, the data string of "dummy data+management information" is inverted. Thereby, the relationship shown in FIG. 8 becomes the same as the relationship shown in FIG. 7. Furthermore, the relationship shown in FIG. 8 can be modified to a relationship shown in FIG. 9. The reason is that the inversion of "1" is "0".

Figure 10:
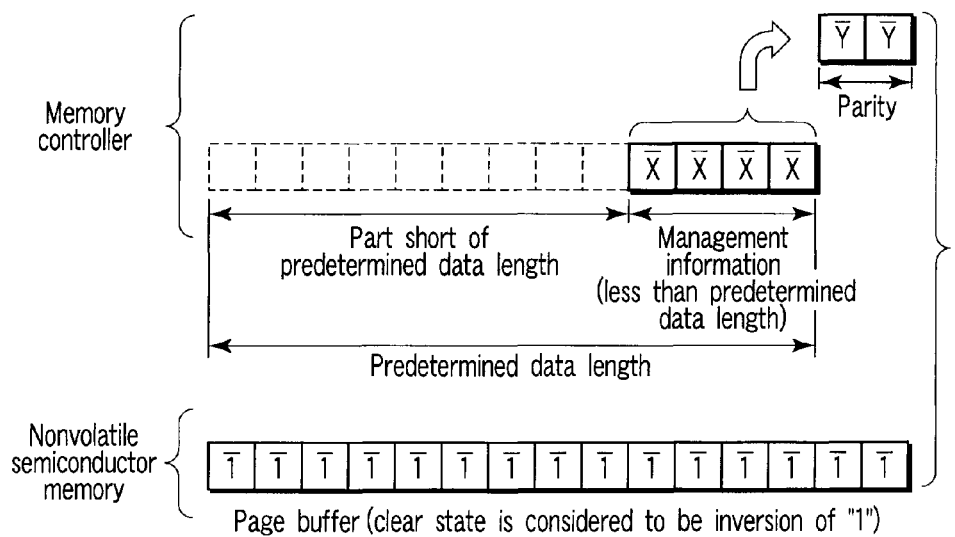
FIG. 10 shows a basic structure of a data transfer method according to a first embodiment of the present invention.

As has been described above at the beginning of the description of this embodiment, the ECC parity that is generated from the data string of less than the predetermined data length becomes identical to the ECC parity that is generated from the data string of the predetermined data length, in which the part short of the predetermined data length is filled with data "0". Thus, as shown in FIG. 10, in the case where the data to be transferred to the nonvolatile semiconductor memory is less than the predetermined data length, that is, in the case where the management information is less than the predetermined data length in this embodiment, the data in the part short of the predetermined data length is regarded as "0". In this example, the dummy data is all regarded as "0". Moreover, in this example, since the dummy data is regarded as "0", the management information is inverted. Thereby, a correct parity can be generated from the inverted short data string of only the management information.

Next, a description is given of a first example at a time when data to be transferred is actually transferred to a nonvolatile semiconductor memory.

FIRST EXAMPLE

When data is to be transferred from the memory controller to the nonvolatile semiconductor memory, if data to be transferred, i.e. management data in this example, is transferred in the state in which the data to be transferred is inverted, data that is different from the data to be transferred would be transferred.

Figure 11:
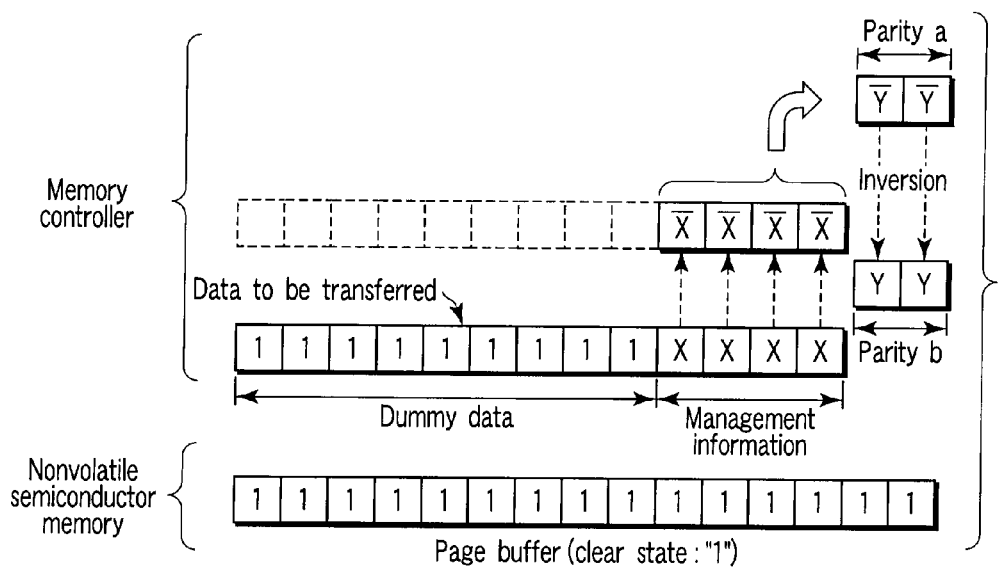
FIG. 11 shows a first example of the data transfer method that is executed by a memory controller according to the first embodiment of the invention.
Figure 12:
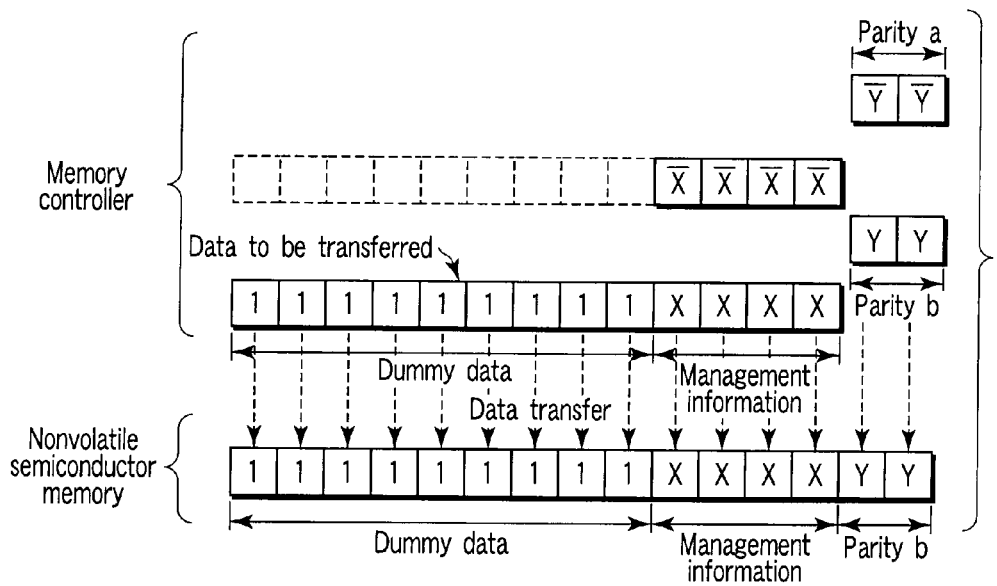
FIG. 12 shows the first example of the data transfer method that is executed by the memory controller according to the first embodiment of the invention.

To cope with this, the memory controller according to this example inputs inverted management information to the ECC core, as shown in FIG. 11, but transfers non-inverted management information to the nonvolatile semiconductor memory, as shown in FIG. 12. Thereby, consideration is given so that data, which is different from the data to be transferred, may not be transferred.

Further, the memory controller of this example generates a parity (parity a) from the inverted management information, as shown in FIG. 11. Since this parity (parity a) "/Y" is a parity that is generated from the inverted management information, this parity is not a parity that is generated from non-inverted management information. If the parity (parity a) "/Y" is transferred to the nonvolatile semiconductor memory as a parity of non-inverted management information, erroneous ECC would be executed.

Thus, the memory controller of this example inverts the parity (parity a) "/Y", as shown in FIG. 11. The parity (parity a) "/Y" becomes a parity (parity b) "Y". The parity (parity b) "Y" is a parity itself, which is generated from the data string of "all '1' dummy data+management information". This is also understood from the fact that the state of data is the same as that shown in FIG. 6.

At last, as shown in FIG. 12, the memory controller transfers the data string of "all '1' dummy data+management information" and the parity (parity b) "Y" that is generated by the ECC core to the nonvolatile semiconductor memory. Alternatively, as shown in FIG. 13, the memory controller may omit the transfer of the dummy data by making use of the clear state "1" of the page buffer, and may transfer the management information and the parity (parity b) "Y" to the nonvolatile semiconductor memory.

As has been described above, according to the first embodiment, the correct parity can be generated from the short data string of less than the predetermined data length. Therefore, the arithmetic process for generating the parity can be made simpler by a degree corresponding to the decrease in size of the data string. Since the arithmetic process for generating the parity is simplified, the memory controller can reduce the time that is needed for data write into the nonvolatile semiconductor memory.

SECOND EXAMPLE

A second example differs from the first example in that the data to be transferred is regarded as the inversion of the clear state of the page buffer.

In this case, the dummy data becomes all "0". Thus, as shown in FIG. 14, only the management information is input to the ECC core, and the ECC core may generate the parity from only the management information.

At last, as shown in FIG. 15, the data string of "dummy data+management information" and the parity generated by the ECC core are inverted and transferred to the nonvolatile semiconductor memory. Alternatively, as shown in FIG. 16, the memory controller may omit the transfer of the dummy data by making use of the clear state "1" of the page buffer, and may invert the management information and the parity and transfer them to the nonvolatile semiconductor memory.

In the second example, like the first example, the correct parity can be generated from the short data string of less than the predetermined data length. Therefore, the arithmetic process for generating the parity can be made simpler by a degree corresponding to the decrease in size of the data string. Since the arithmetic process for generating the parity is simplified, the memory controller can reduce the time that is needed for data transfer to the nonvolatile semiconductor memory.

Next, examples of the page format that is applicable to the present embodiment are described.

FIG. 17A shows an example of the page format.

The page format shown in FIG. 17A is an example in which a redundant unit data area, where management information is written, can be secured only at one part in every page. In particular, in the case where the nonvolatile semiconductor memory is a multi-value memory or a memory that can adopt a multi-value scheme, the page format as shown in FIG. 17A is adopted.

As shown in FIG. 17A, in the page format according to the example, one redundant unit area in which management information is written is included at a last part of the page. The page format according to the example includes user data 0 to user data 3. The user data 0 to user data 3 are data unit areas. The data unit area is an area in which data from the host apparatus is written. Each of the user data 0 to user data 2 has a predetermined data length. The parity area is set behind each of the user data 0 to user data 2. A parity 0 is a parity of the user data 0. Similarly, a parity 1 is a parity of the user data 1, and a parity 2 is a parity of the user data 2. A redundant unit area is secured behind the user data 3 at the last part of the page. The management information is written in the redundant unit area. A data string of "user data 3+management information" has a predetermined data length. A parity 3 is a parity of the "user data 3+management information".

The user data does not always use the entirety of one page.

For example, as shown in FIG. 17B, there is a case in which only the user data 0 and management information are written. In this case, dummy data is written in the user data 3 at the last part, and the parity 3 is generated from the data string of "dummy data+management information". This is as described above.

Figure 17:
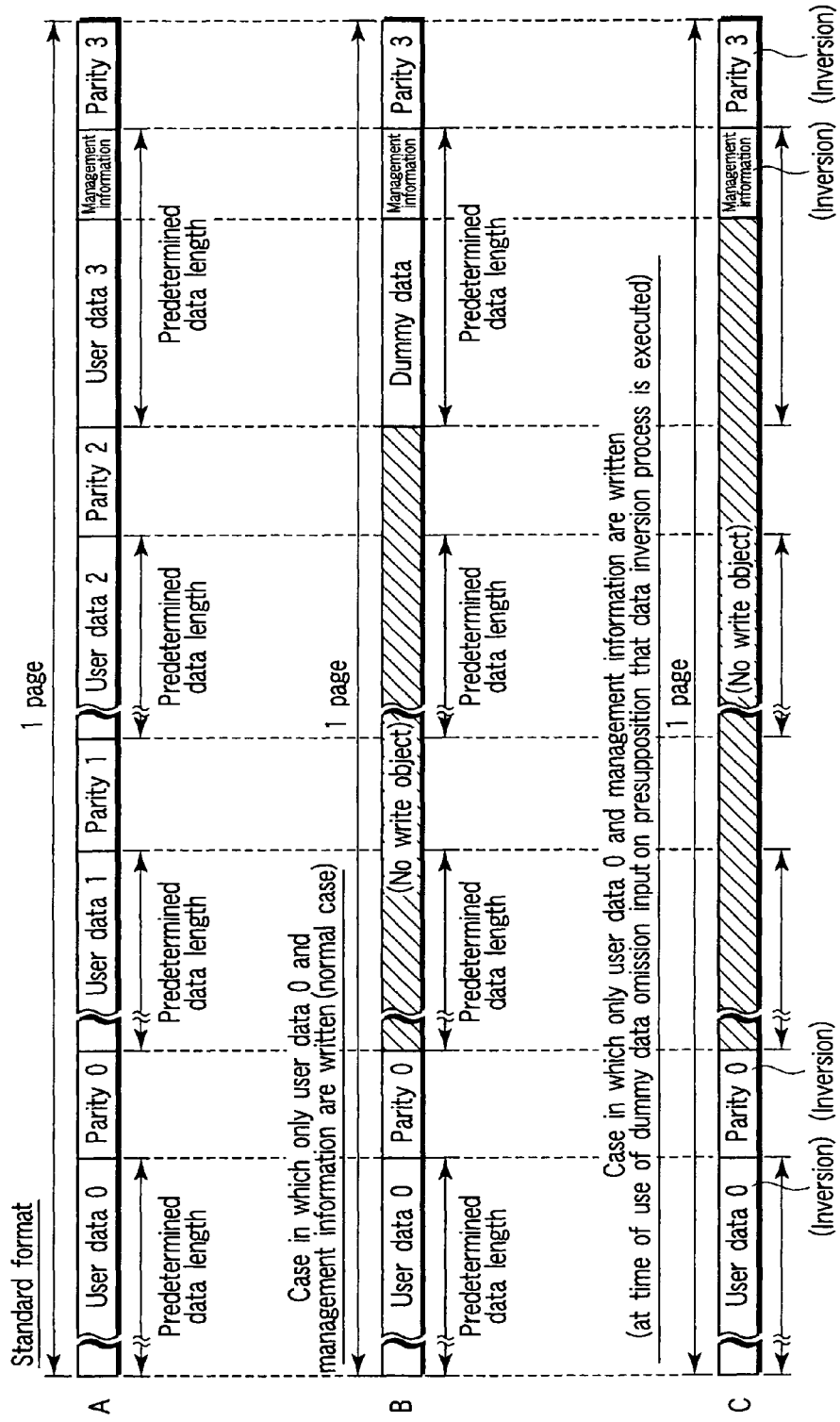
FIG. 17A shows an example of a page format to which the present invention is applicable.
FIG. 17B shows an example of a page format to which the present invention is applicable.
FIG. 17C shows an example of a page format to which the present invention is applicable.

If the present embodiment is applied to the page format of this example, a page format shown in FIG. 17 is obtained.

FIG. 17C shows the case in which the above-described second embodiment is applied to the data transfer method, and only the user data 0 and management information is written.

If the second example is applied, the memory controller converts the user data 0 and the parity 0 thereof, and transfers the inverted data and parity to the nonvolatile semiconductor memory. Then, the memory controller inverts the management information and the parity 3, which is the parity of the management information generated according to the second example, and transfers the inverted management information and parity to the nonvolatile semiconductor memory.

As has been described above, the present embodiment is applicable to the page format in which only one redundant unit data area, in which management information is written, can be secured in every page.

An example of the page format, to which the first example is applied, is omitted here. Needless to say, the first example, like the second example, is applicable to the page format, for example, as shown in FIG. 17A.

Second Embodiment

A second embodiment of the invention relates to the hardware structure of the memory controller to which the first embodiment is applied.

FIRST EXAMPLE

Figure 18:
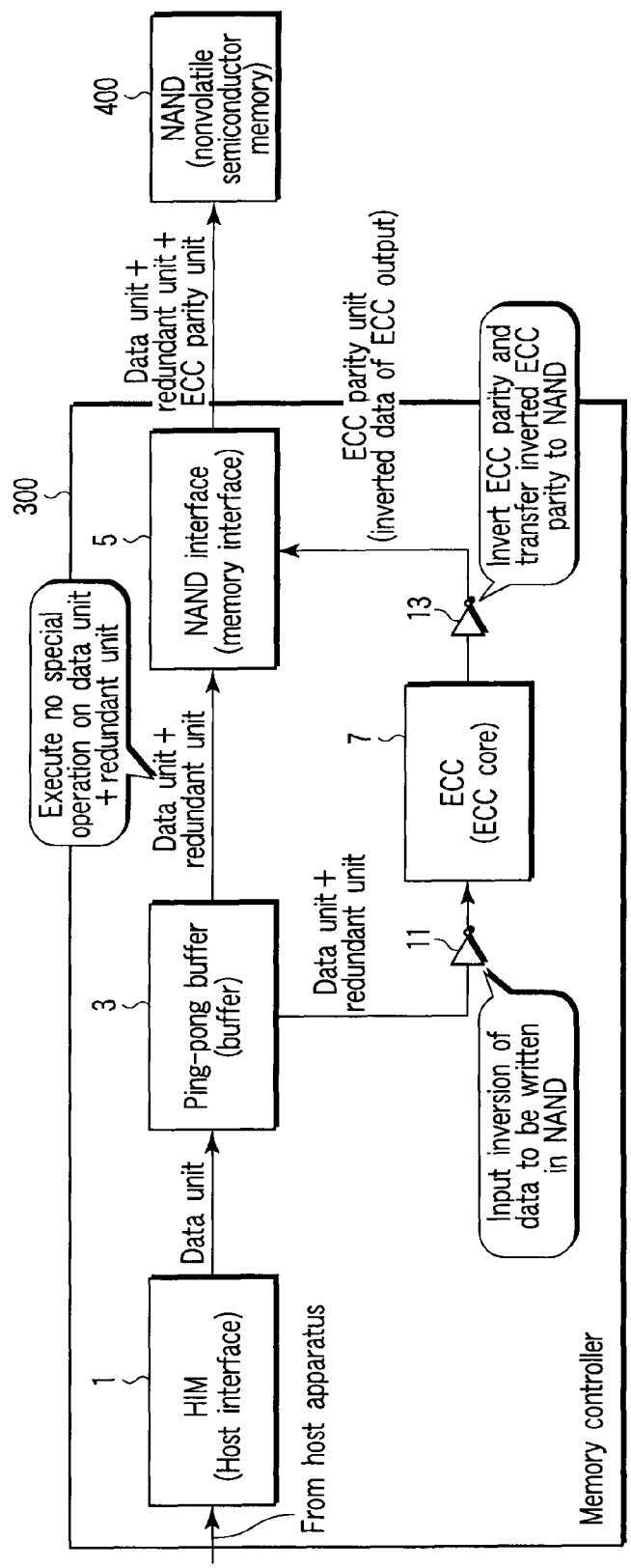
FIG. 18 is a block diagram showing a first example of a hardware structure (at a time of a write process) of a memory controller according to a second embodiment of the invention.
Figure 19:
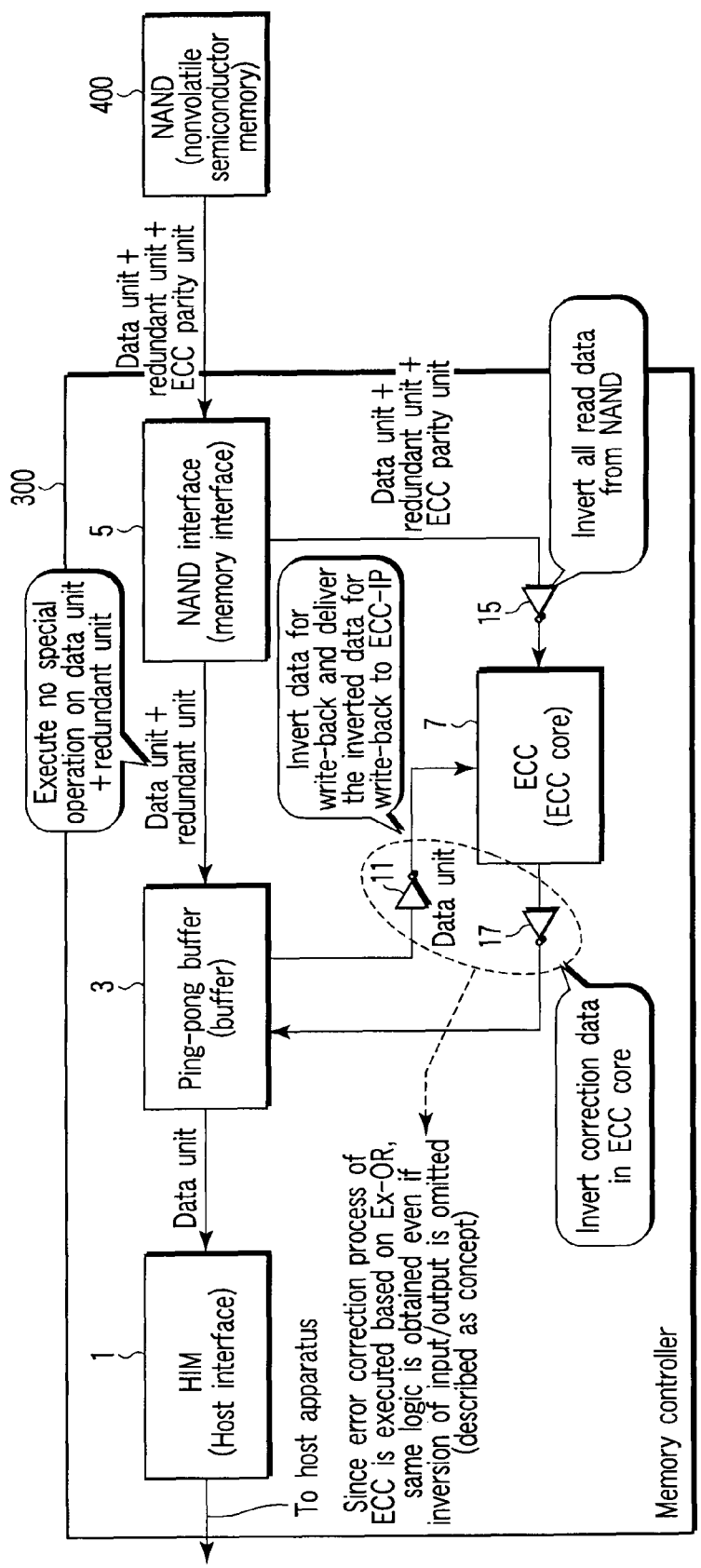
FIG. 19 is a block diagram showing the first example of the hardware structure (at a time of a read process) of the memory controller according to the second embodiment of the invention.

FIG. 18 and FIG. 19 are block diagrams showing a first example of the hardware structure of a memory controller according to the second embodiment of the present invention. FIG. 18 illustrates a write process of data write to the nonvolatile semiconductor memory, and FIG. 19 illustrates a read process of data read from the nonvolatile semiconductor memory. This first example adopts the data transfer method according to the first example described in the first embodiment. In addition, this first example adopts the page formats shown in FIG. 17A to FIG. 17C.

(At Time of Write Process)

As shown in FIG. 18, write data from the host apparatus (not shown) is input to a host interface module (HIM) 1 of the memory controller 300.

For example, in the case where the write data is filled up to the last part of the page format, the HIM 1 writes the write data in a data unit, and transfers the data unit, in which the write data is written, to a ping-pong buffer 3.

The ping-pong buffer 3 adds a redundant unit, in which management information, for instance, is written, to the data unit, and inputs a data string of "data unit+redundant unit" to a memory interface (NAND interface) 5. Further, the ping-pong buffer 3 inverts the data string of "data unit+redundant unit" via an inverter 11, and inputs the inverted data string to an ECC core 7.

For example, in the case where there is no write data at the last part of the page format, the HIM 1 or ping-pong buffer 3 writes a dummy data string in the data unit.

The ECC core 7 generates an ECC parity from the inverted data string of "data unit+redundant unit". However, in the case where a dummy data string is written in the "data unit", the ECC core 7 generates an ECC parity from the data string of only "redundant unit" according to the first example of the first embodiment. Thereby, the arithmetic process for generating the ECC parity is simplified. The generated ECC parity is inverted via an inverter 13, and the inverted ECC parity is input to the memory interface 5.

The memory interface 5 adds an "ECC parity unit" to the "data unit+redundant unit" that is directly input from the ping-pong buffer 3. The inverted ECC parity is written in the ECC parity unit. The memory interface 5 adds the "ECC parity unit", in which the inverted ECC parity is written, to the "data unit+redundant unit", and transfers the resultant data string to a nonvolatile semiconductor memory 400.

The transferred data string of "data unit+redundant unit+ECC parity unit" is input to a page buffer (not shown) of the nonvolatile semiconductor memory 400, and is temporarily stored in the page buffer. Thereafter, the data string of "data unit+redundant unit+ECC parity unit", which is temporarily stored in the page buffer, is written in the memory cells (not shown) of the nonvolatile semiconductor memory. An example of the nonvolatile semiconductor memory 400 is a NAND-type flash memory.

(At Time of Read Process)

As shown in FIG. 19, read-out data which is read out of the nonvolatile semiconductor memory 400 is input to the memory interface 5 of the memory controller 300. The read-out data is a data string of "data unit+redundant unit+ECC parity unit".

The memory interface 5 inverts the data string of "data unit+redundant unit+ECC parity unit" via an inverter 15, and inputs the inverted data string to the ECC core 7. Further, the memory interface 5 separates "data unit+redundant unit" from the data string of "data unit+redundant unit+ECC parity unit", and inputs the separated "data unit+redundant unit" to the ping-pong buffer 3.

The ECC core 7 generates correction data from the data string of "data unit+redundant unit+ECC parity unit". The correction data is data for correcting an error if such an error is present in the read-out data ("data unit+redundant unit"). The correction data is inverted via the inverter 17 and input to the ping-pong buffer 3.

If an error is present in the read-out data ("data unit+redundant unit"), the ping-pong buffer 3 corrects the error on the basis of the inverted correction data. If there is no error, the error correction is not executed.

In the case where the read process is read-out to the host apparatus, the ping-pong buffer 3 separates the "data unit" from the read-out data ("data unit+redundant unit") which is corrected if there is an error, and inputs the "data unit" to the HIM 1. The HIM 1 outputs the data of the "data unit" to the host apparatus as read-out data.

In the case where the read process is a write-back process of write-back to the nonvolatile semiconductor memory, the ping-pong buffer 3 returns to the write process illustrated in FIG. 18. FIG. 19 shows that the read-out data ("data unit+redundant unit"), which is corrected if there is an error, is inverted via the inverter 11 and is input to the ECC core 7.

The error correction process by the ECC core 7 is executed on the basis of agreement/disagreement, for example, an exclusive-OR logic. Thus, the input/output inversion process may be omitted. For example, the inverters 15 and 17 shown in FIG. 19 may be dispensed with.

According to the first example of the second embodiment, an example of the hardware structure of the memory controller, which realizes the data transfer method according to the first example of the first embodiment, can be obtained.

SECOND EXAMPLE

FIG. 20 and FIG. 21 are block diagrams showing a second example of the hardware structure of the memory controller according to the second embodiment of the invention. FIG. 20 illustrates a write process of data write to the nonvolatile semiconductor memory, and FIG. 21 illustrates a read process of data read from the nonvolatile semiconductor memory. This second example adopts the data transfer method according to the second example of the first embodiment. In addition, this second example adopts the page formats shown in FIG. 17A to FIG. 17C.

(At Time of Write Process)

When the write process is executed, as shown in FIG. 20, a data string of "data unit+redundant unit+ECC parity unit", which is output from the memory interface 5, may be converted via an inverter 19 which is provided between the memory interface 5 and nonvolatile semiconductor memory 400, and the inverted data string may be transferred to the nonvolatile semiconductor memory 400.

The ECC core 7 generates an ECC parity from the data string of "data unit+redundant unit". However, in the case where a dummy data string is written in the "data unit", the ECC core 7 generates the ECC parity from the data string of only "redundant unit" according to the second example of the first embodiment. Thereby, the arithmetic process for generating the ECC parity can be simplified.

(At Time of Read Process)

When the read process is executed, as shown in FIG. 21, read-out data, which is read out of the nonvolatile semiconductor memory 400, may be converted, for example, by an inverter 21 which is provided between the memory interface 5 and nonvolatile semiconductor memory 400, and the inverted data string may be input to the memory interface 5.

According to the second example of the second embodiment, an example of the hardware structure of the memory controller, which realizes the data transfer method according to the first example of the first embodiment, can be obtained.

Third Embodiment

A third embodiment of the invention relates to an electronic apparatus to which the memory controllers as described in the preceding embodiments are applicable.

A memory medium, such as a memory card, is an example of the electronic apparatus to which the memory controllers as described in the preceding embodiments are applicable. An example of the memory card is described below.

(Example of Memory Card)

Figures 22, 23:
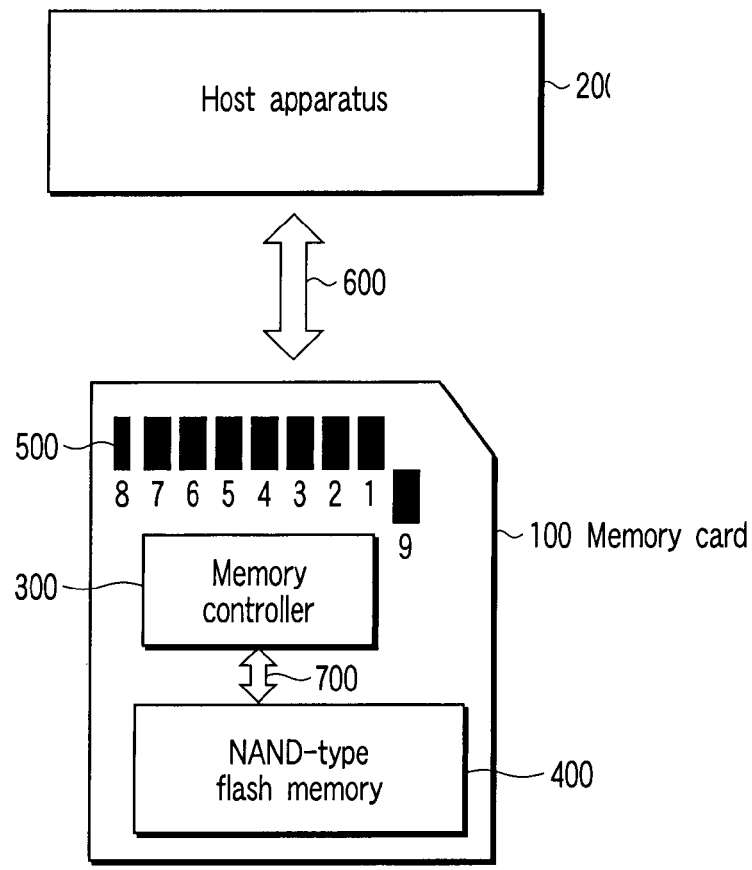
FIG. 22 shows an example of a memory card.
FIG. 23 shows an example of signal assignment in the memory card.

FIG. 22 shows an example of the memory card.

As shown in FIG. 22, the memory card 100 transmits/receives data to/from a host apparatus 200 via a bus interface 600. The memory card 100 is configured to be insertable in a slot formed in the host apparatus 200.

The memory card 100 includes a memory controller 300, a nonvolatile semiconductor memory (hereinafter referred to as "flash memory") 400 and a card terminal 500.

The memory controller 300 controls the flash memory 400. An example of the flash memory 400 is a NAND-type flash memory.

The card terminal 500 is a signal pin that is electrically connected to the memory controller 300, and functions as an external pin of the memory card 100. The card terminal 500 in this embodiment comprises a plurality of signal pins (first to ninth pins). FIG. 23 shows an example of signal assignment to the first pin to the ninth pin.

As shown in FIG. 23, data 0 to data 3 are assigned to the seventh pin, eighth pin, ninth pin and first pin. The first pin is assigned not only to the data 3, but also to a card detection signal. The second pin is assigned to a command. The third pin and sixth pin are assigned to a ground potential Vss. The fourth pin is assigned to a power supply potential Vdd, and the fifth pin is assigned to a clock signal.

The external terminal 500 and bus interface 600 are used for communication between a host apparatus controller (not shown) in the host apparatus 200 and the memory card 100. For example, the host apparatus controller communicates various signals and data with the memory controller 300 in the memory card 100 via the first to ninth pins. For example, when data is to be written in the memory card 100, the host apparatus controller transmits a write command to the memory controller 300 via the second pin. At this time, in response to the clock signal that is supplied to the fifth pin, the memory controller 300 receives the write command that is delivered to the second pin. The second pin, which is assigned to the input of the command, is disposed between the first pin for the data 3 and the third pin for the ground potential Vss.

On the other hand, communication between the memory controller 300 and flash memory 400 is executed via an IO line (data line) 700 of, e.g. 8 bits.

When the memory controller 300 writes data in the flash memory 400, the memory controller 300 successively inputs a data input command 80h, a column address, a page address, data and a program command 10h to the flash memory 400 via the IO line 700. The symbol "h" of the command 80h indicates a hexadecimal number. Actually, an 8-bit signal "10000000" is delivered in parallel to the 8-bit IO line 700. In addition, the transmission of the command to the flash memory 400 and the transmission/reception of the data are executed by commonly using the IO line 700.

FIG. 24 is a block diagram of an example of the hardware structure of the memory card.

The host apparatus 200 includes hardware and software for accessing the memory card 100. Examples of the host apparatus 200 are a mobile phone, a digital camera (video camera, still camera), audio equipment, audio/video equipment, a game machine, an electronic musical instrument, a TV, a personal computer, a personal digital assistant, a voice recorder, a PC card, and an electronic book terminal.

The memory card 100 is supplied with power when it is connected to the host apparatus 200, and operates to execute a process corresponding to an access from the host apparatus 200.

In the flash memory 400, the erase block size (block size of an erasure unit) at a time of erase is set at a predetermined size (e.g. 256 kB). In addition, data write and data read are executed in the flash memory 400 in a unit called "page" (e.g. 2 kB).

The memory controller 300 manages the physical state in the flash memory 400 (e.g. which of numerically ordered logical sector address data is stored at which physical block address, or which block is in an erased state). The memory controller 300 includes a host apparatus interface 301, a CPU (Central Processing Unit) 303, a memory interface (flash interface) 305, a ROM (Read-Only Memory) 307, a RAM (Random Access Memory) 309, a buffer (Buffer) 311, and an ECC core 313.

The host apparatus interface 301 executes an interface process between the host apparatus 200 and the memory controller 300. The host interface 301 corresponds to the HIM 1 shown in FIG. 18 to FIG. 21.

The CPU 303 controls the operation of the whole memory card 100. For example, when the memory card 100 is supplied with power, the CPU 303 reads out firmware (control program) from the ROM 307 and loads it in the RAM 309, and then executes a predetermined process, thereby creating various tables in the RAM 309.

In addition, the CPU 303 receives a write command, a read command and an erase command from the host apparatus 200, executes a predetermined process on the flash memory 400, and controls a data transfer process via the buffer 311.

The ROM 307 stores the control programs, etc., which are executed by the CPU 303.

The RAM 309 is used as a working area of the CPU 303 and stores the control programs and various tables.

The memory interface 305 executes an interface process between the memory controller 300 and the flash memory 400. The memory interface 305 corresponds to the memory interface 5 shown in FIG. 18 to FIG. 21.

The buffer 311 temporarily stores a predetermined amount of data (e.g. 1-page data) when data sent from the host apparatus 200 is to be written in the flash memory 400, and temporarily stores a predetermined amount data when data read out of the flash memory 400 is to be sent to the host apparatus 200. The buffer 311 corresponds to the ping-pong buffer 3 shown in FIG. 18 to FIG. 21.

The ECC core 313 generates an ECC parity from data that is sent from the host apparatus 200, when data is to be written in the flash memory 400. When data is to be read out of the flash memory 400, if there is an error between the written data and read-out data, the ECC core 313 detects and corrects the error on the basis of the ECC parity. The ECC core 313 corresponds to the ECC core 7 shown in FIG. 18 to FIG. 21.

The memory controller in the above-described embodiments is applicable to the memory card shown in FIG. 22 to FIG. 24.

The above-described embodiments can provide the memory controller which can reduce the time that is needed for data transfer to the nonvolatile semiconductor memory.

The above-described embodiments include the following aspects:

(1) A memory controller which is connectable to a memory and controls the memory, comprising:
a buffer to which data, which is to be transferred to the memory, is input;
an ECC parity generating unit which generates an ECC parity in units of a predetermined data length from the data which is to be transferred to the memory; and
a memory interface which adds the generated ECC parity in units of the predetermined data length, and delivers the data with the ECC parity to the memory,
wherein when a data length of the data which is to be transferred to the memory is less than the predetermined data length, the ECC parity generating unit regards data of a part that is short of the predetermined data length as "0", and generates the ECC parity from the data of less than the predetermined data length.

(2) The memory controller according to (1), wherein the ECC parity generating unit generates a parity from inverted data which is obtained by inverting the data of less than the predetermined data length, and delivers an inverted parity, which is obtained by inverting the generated parity, to the memory interface, and
the memory interface adds the inverted parity to at least the data of less than the predetermined data length, and delivers the data with the inverted parity to the memory.

(3) The memory controller according to (1), wherein the ECC parity generating unit generates a parity from the data of less than the predetermined data length, and delivers the generated parity to the memory interface,
the memory interface adds the parity to at least the data of less than the predetermined data length, and
at least the data of less than the predetermined data length and the parity, which are output from the memory interface, are inverted and delivered to the memory.

(4) The memory controller according to any one of (1) to (3), wherein the ECC parity generating unit uses a cyclic code as an error correcting code.

(5) The memory controller according to (4), wherein the cyclic code is a Reed-Solomon code.

The present invention has been described with reference to some embodiments, but the invention is not limited to the embodiments. The invention can be variously modified, in practice, without departing from the spirit of the invention.

Each of the embodiments can be practiced independently, but the embodiments may properly be combined and practiced.

Each of the embodiments includes inventions in various stages, and inventions in various stages can be derived from proper combinations of structural elements disclosed in each embodiment.

In the above-described embodiments, the invention is applied to the controller that controls the nonvolatile semiconductor memory. However, the invention is not limited to the memory controller, and the invention covers semiconductor integrated circuit devices incorporating the controller, such as processors, system LSIs, etc.

The NAND-type flash memory has been described as an example of the nonvolatile semiconductor memory. However, the nonvolatile semiconductor memory that is controlled by the memory controller according to the above-described embodiments is not limited to the NAND-type flash memory, and may be an AND-type flash memory, a NOR-type flash memory, etc., other than the NAND-type flash memory.

What is claimed is:

1. A memory controller which is connectable to a memory and controls the memory, comprising:
a buffer to which data, which is to be transferred to the memory, is input;
an ECC parity generating unit which generates an ECC parity in units of a predetermined data length from the data which is to be transferred to the memory; and
a memory interface which adds the generated ECC parity in units of the predetermined data length, and delivers the data with the ECC parity to the memory,
wherein when a data length of the data which is to be transferred to the memory is less than the predetermined data length, the ECC parity generating unit regards data of a part that is short of the predetermined data length as "0", and generates the ECC parity from the data of less than the predetermined data length,
wherein the ECC parity generating unit generates a parity from inverted data which is obtained by inverting the data of less than the predetermined data length, and delivers an inverted parity, which is obtained by inverting the generated parity, to the memory interface, and
the memory interface adds the inverted parity to at least the data of less than the predetermined data length, and delivers the data with the inverted parity to the memory.

2. The memory controller according to claim 1, wherein the memory interface inverts data of a predetermined data length, which is read out of the memory, inputs the inverted data to the ECC parity generating unit, and inputs data of less than the predetermined data length, which is included in the read-out data, to the buffer,
the ECC parity generating unit inverts, if an error is present in the input data, correction data for correcting the error, and inputs the inverted correction data to the buffer, and
the buffer corrects, if an error is present in the input data of less than the predetermined data length, the error on the basis of the inverted correction data.

3. The memory controller according to claim 1, wherein the ECC parity generating unit generates a parity from the data of less than the predetermined data length, and delivers the generated parity to the memory interface,
the memory interface adds the parity to at least the data of less than the predetermined data length, and
at least the data of less than the predetermined data length and the parity, which are output from the memory interface, are inverted and delivered to the memory.

4. The memory controller according to claim 1, wherein the memory interface inputs data of a predetermined data length, which is read out of the memory and is inverted, to the ECC parity generating unit, and inputs data of less than the predetermined data length, which is included in the read-out data, to the buffer, the ECC parity generating unit inputs, if an error is present in the input data, correction data for correcting the error to the buffer, and the buffer corrects, if an error is present in the input data of less than the predetermined data length, the error on the basis of the inverted correction data.

5. The memory controller according to claim 1, wherein the ECC parity generating unit uses a cyclic code as an error correcting code.

6. The memory controller according to claim 5, wherein the cyclic code is a Reed-Solomon code.

7. The memory controller according to claim 5, wherein the cyclic code is a BCH code.

8. A semiconductor memory device comprising:

a memory; and a memory controller which is connectable to the memory and controls the memory, the memory controller comprising:

a buffer to which data, which is to be transferred to the memory, is input;

an ECC parity generating unit which generates an ECC parity in units of a predetermined data length from the data which is to be transferred to the memory; and a memory interface which adds the generated ECC parity in units of the predetermined data length, and delivers the data with the ECC parity to the memory, wherein when a data length of the data which is to be transferred to the memory is less than the predetermined data length, the ECC parity generating unit regards data of a part that is short of the predetermined data length as "0", and generates the ECC parity from the data of less than the predetermined data length, wherein the ECC parity generating unit generates a parity from inverted data which is obtained by inverting the data of less than the predetermined data length, and delivers an inverted parity, which is obtained by inverting the generated parity, to the memory interface, and the memory interface adds the inverted parity to at least the data of less than the predetermined data length, and delivers the data with the inverted parity to the memory.

9. The device according to claim 8, wherein the memory interface inverts data of a predetermined data length, which is read out of the memory, inputs the inverted data to the ECC parity generating unit, and inputs data of less than the predetermined data length, which is included in the read-out data, to the buffer, the ECC parity generating unit inverts, if an error is present in the input data, correction data for correcting the error, and inputs the inverted correction data to the buffer, and the buffer corrects, if an error is present in the input data of less than the predetermined data length, the error on the basis of the inverted correction data.

10. The device according to claim 8, wherein the ECC parity generating unit generates a parity from the data of less than the predetermined data length, and delivers the generated parity to the memory interface, the memory interface adds the parity to at least the data of less than the predetermined data length, and at least the data of less than the predetermined data length and the parity, which are output from the memory interface, are inverted and delivered to the memory.

11. The device according to claim 8, wherein the memory interface inputs data of a predetermined data length, which is read out of the memory and is inverted, to the ECC parity generating unit, and inputs data of less than the predetermined data length, which is included in the read-out data, to the buffer, the ECC parity generating unit inputs, if an error is present in the input data, correction data for correcting the error to the buffer, and the buffer corrects, if an error is present in the input data of less than the predetermined data length, the error on the basis of the inverted correction data.

12. The device according to claim 8, wherein the ECC parity generating unit uses a cyclic code as an error correcting code.

13. The device according to claim 12, wherein the cyclic code is a Reed-Solomon code.

14. The device according to claim 12, wherein the cyclic code is a BCH code.

* * * * *